(12) United States Patent
Fukuyama et al.

(10) Patent No.: US 8,137,825 B2
(45) Date of Patent: Mar. 20, 2012

(54) ALUMINUM NITRIDE SINGLE CRYSTAL FILM, ALUMINUM NITRIDE SINGLE CRYSTAL MULTI-LAYER SUBSTRATE AND MANUFACTURING PROCESSES THEREOF

(75) Inventors: Hiroyuki Fukuyama, Sendai (JP); Kazuya Takada, Shunan (JP); Akira Hakomori, Shunan (JP)

(73) Assignees: Tokuyama Corporation, Shunan-Shi (JP); Tohoku University, Sendai-Shi (JP)

( * ) Notice: Subject to any disclaimer, the term of this patent is extended or adjusted under 35 U.S.C. 154(b) by 1084 days.

(21) Appl. No.: 11/989,841

(22) PCT Filed: Aug. 1, 2006

(86) PCT No.: PCT/JP2006/315566
§ 371 (c)(1),
(2), (4) Date: Feb. 1, 2008

(87) PCT Pub. No.: WO2007/015572
PCT Pub. Date: Feb. 8, 2007

(65) Prior Publication Data
US 2010/0215987 A1 Aug. 26, 2010

(30) Foreign Application Priority Data
Aug. 4, 2005 (JP) .................. 2005-227165

(51) Int. Cl.
*B32B 9/00* (2006.01)
(52) U.S. Cl. ......... 428/698; 428/701; 428/702; 117/952
(58) Field of Classification Search .................. None
See application file for complete search history.

(56) References Cited

U.S. PATENT DOCUMENTS

| | | | |
|---|---|---|---|
| 2003/0170503 A1 | 9/2003 | Shibata et al. | |
| 2005/0059257 A1 | 3/2005 | Fukuyama et al. | |
| 2006/0175619 A1 | 8/2006 | Fukuyama et al. | |

FOREIGN PATENT DOCUMENTS

| | | |
|---|---|---|
| JP | 2004-137142 A | 5/2004 |
| JP | 2004-142953 A | 5/2004 |
| JP | 2004-345868 A | 12/2004 |
| JP | 2005-104829 A | 4/2005 |
| JP | 2006-213586 A | 8/2006 |

OTHER PUBLICATIONS

G.A Slack and T.F. Mcnelly. Journal of Crystal Growth. vol. 34, pp. 263, 1976.
European Search Report dated Aug. 22, 2011, issued in corresponding European application No. 06768428.2.

*Primary Examiner* — Timothy Speer
(74) *Attorney, Agent, or Firm* — Birch, Stewart, Kolasch & Birch, LLP

(57) ABSTRACT

In a method of manufacturing an aluminum nitride single crystal film on a substrate by heating a sapphire substrate in the presence of carbon, nitrogen and carbon monoxide, an aluminum compound which differs from the raw material sapphire substrate and the formed aluminum nitride single crystal and can control the concentration of aluminum in the heating atmosphere, such as aluminum nitride or alumina, is made existent in a reaction system to promote a reduction nitriding reaction.
An aluminum nitride single crystal multi-layer substrate having an aluminum nitride single crystal film on the surface of a sapphire substrate, wherein the aluminum nitride single crystal has improved crystallinity and a low density of defects, is provided.

9 Claims, 3 Drawing Sheets

ALUMINUM NITRIDE SINGLE CRYSTAL FILM, ALUMINUM NITRIDE SINGLE CRYSTAL MULTI-LAYER SUBSTRATE AND MANUFACTURING PROCESSES THEREOF

FIELD OF THE INVENTION

The present invention relates to an aluminum nitride single crystal film, an aluminum nitride single crystal multi-layer substrate having the film on a single crystal α-alumina substrate and manufacturing processes thereof.

DESCRIPTION OF THE PRIOR ART

Gallium nitride (GaN), aluminum nitride (AlN), indium nitride (InN) and mixed crystals thereof are called "group III nitride semiconductors" and known as functional layers constituting light emitting devices such as light emitting diodes (LED) or laser diodes (LD) which emit visible to ultraviolet light. Out of these, GaN, AlN and aluminum gallium nitride (AlGaN) which is a mixed crystal thereof are attracting much attention as substances capable of constituting a device which emits blue to ultraviolet short-wavelength light.

To manufacture these semiconductor devices, a process in which a multi-layer thin film is deposited on a silicon single crystal or α-alumina ($Al_2O_3$) single crystal (may also be referred to as "sapphire" hereinafter) substrate by vapor-phase epitaxial growth means such as a molecular beam epitaxy (MBE) or metal-organic vapor phase epitaxy (MOVPE) is generally used.

However, high-density defects are introduced in a film forming process due to mismatching in lattice parameter and thermal expansion coefficient between the substrate material and these semiconductor crystals. These defects cause reductions in the energy efficiency and service life of the obtained semiconductor device. Therefore, the development of a substrate material which well matches a multi-layer film and can eliminate the introduction of defects is the most important object which will bring a great breakthrough in this field.

To attain the above object, for a device comprising a group III nitride-based semiconductor, a substrate of the same type of material which has excellent matching in lattice is desirably used. For example, AlN crystal is desirably used for an AlGaN crystal layer having a high concentration of all.

As means of obtaining AlN crystal which can be used as an AlGaN-based semiconductor multi-layer substrate, there is known a sublimation and re-condensation method in which an AlN powder is sublimated into a vapor phase in a super high-temperature environment at about 2,250° C. and then condensed into seed crystal (G. A. Slack and T. F. Mcnelly, Journal of Crystal Growth, Volume 34, pp. 263, 1976). Although AlN single crystal obtained by the above sublimation and re-condensation method has higher quality than an AlN thin film obtained by a vapor-phase epitaxial method which will be described hereinafter, it is difficult to obtain an AlN single crystal film having a long diameter of 10 mm or more. Therefore, the method has a problem with mass-productivity.

Meanwhile, a large number of technologies for obtaining AlN crystal on a sapphire substrate or a silicon carbide single crystal substrate by using vapor-phase epitaxial methods such as MBE, MOVPE and hydride vapor-phase epitaxy (HVPE) are now under study. Although it is relatively easy to increase the diameter of an AlN crystal substrate in these technologies, as it is difficult to control the small-angle rotation with the c-axis as the axis of rotation of individual crystal contained in a thin film oriented such that the c-axis of AlN becomes parallel to the normal of the surface of the substrate (to be referred to as "c-axis orientation" hereinafter), a threading dislocation tends to occur at the association portion of AlN crystal grains grown from different nuclei.

These evaluations are generally made with a full width at half maximum of a ω-mode rocking curve obtained by X-ray diffractometer (XRD). The full width at half maximum of the rocking curve is a range of ω which takes 50% or more of the maximum value of the detected count number in a diffraction chart obtained by fixing the angle formed by an X-ray generator and a detector to an angle at which a specimen satisfies Bragg diffraction conditions and changing the X-ray incident angle ω. As this value of the crystal becomes smaller, the number of defects such as threading dislocations becomes smaller and the quality becomes higher.

Although the measurement value of the {0 0 0 2} plane perpendicular to the c-axis of AlN is 300 arcsec (3,600 arcsec=1°) or less in the vapor-phase epitaxial growth method such as MBE, MOVPE or HVPE, it is extremely difficult to reduce the measurement value of the {1 –1 0 0} plane parallel to the c-axis to 1,200 arcsec or less for the above reason.

The four-digit number including curly braces or parentheses used in this text indicates a Miller index used for hexagonal crystal, and a negative index is represented as follow according to the original notational system.

$$\{1\ \overline{1}\ 0\ 0\} \rightarrow \{1\ -1\ 0\ 0\}$$

In short, although AlN crystal having a high orientation and few defects is needed to ensure matching with the multi-layer film of a device for the implementation of the above-described device which emits blue to ultraviolet short-wavelength light, existing methods for obtaining the AlN crystal have a problem with mass-productivity or crystal quality.

Prior to the present invention, the inventors of the present invention developed the method of forming a highly crystalline AlN film from alumina, carbon (C), nitrogen ($N_2$) and carbon monoxide (CO) by using a reduction nitriding reaction and already proposed it in JP-A 2004-137142. In this method, aluminum oxynitride (alon) is automatically formed at the interface between both phases and functions as a buffer layer by converting alumina into AlN from the surface of a raw material sapphire substrate toward the inside unlike prior art means in which a thin film of the target is deposited on the substrate, thereby making it possible to form satisfactory AlN crystal. Since AlN crystal is formed over the entire surface of the raw material sapphire substrate under such conditions that the nitriding reaction proceeds, an AlN crystal substrate having a large diameter can be easily obtained according to the shape of the raw material sapphire substrate.

Further, as disclosed in Japanese Patent Application No. 2005-031086, they developed a multi-layer substrate having a structure that alon does not exist in the substrate after the reaction and lattice mismatching is modified while defects which occur at the interface between the raw material sapphire substrate and the AlN single crystal film are prevented from being diffused into the both layers and improved the quality of the AlN crystal by preventing the residual strain caused by the difference in thermal expansion coefficient between the raw material sapphire substrate and the AlN single crystal film.

In order to further improve the quality of the AlN crystal, the inventors of the present invention have conducted intensive studies on the reason that AlN crystals oriented in multiple directions are existent according to the surface state of the unreacted raw material sapphire substrate which was confirmed in Japanese Patent Application No. 2005-031086 and have paid attention to a decomposition reaction which occurs in α-alumina and AlN under nitriding reaction conditions.

SUMMARY OF THE INVENTION

Since the nitriding reaction of alumina used in the present invention is carried out at a temperature 400° C. or more higher than the general temperature for growing AlN crystal by MOVPE or HVPE, the equilibrium partial pressure of the decomposition reaction of alumina or AlN into Al or an aluminum compound such as $Al_2O$ on the surface is considerably high. Therefore, it is considered that the atomic plane exposed to the surface of the raw material sapphire substrate turns into a state where aluminum atomic layer and an oxygen atomic layer are existent regardless of the previous surface treatment under such conditions that the nitriding reaction does not complete swiftly on the most surface and that the existence of AlN crystals oriented in multiple directions and the shift of lattice of one atomic layer called "inversion domain" occur.

Simultaneously, driving force by which aluminum atoms move from the inside of the substrate to the surface is generated. As a result, it is conceivable that the movement of aluminum atoms might produce unevenness on the surface of the substrate and disturb the regularity of the crystal lattice in the substrate to reduce the quality of the crystal.

The inventors of the present invention tried a nitriding reaction by installing a mechanism for mixing aluminum into an atmosphere to which the raw material substrate was exposed while the concentration of aluminum was suitably controlled in a reactor and supplying a gas formed from the surface of the raw material sapphire substrate and the formed AlN film from the outside under nitriding reaction conditions and obtained the effect of further improving crystallinity and reducing the density of defects in an AlN single crystal multi-layer substrate having an AlN single crystal film on the surface of the raw material sapphire substrate. The present invention has been accomplished based on this finding.

That is, it is an object of the present invention to provide an aluminum nitride single crystal film comprising aluminum nitride single crystal having an area of 15 cm² or more and a threading dislocation density of $5 \times 10^6$ cm$^{-2}$ or less. The preferred area is 15 to 180 cm².

It is another object of the present invention to provide an aluminum nitride single crystal multi-layer substrate having an aluminum nitride single crystal film on the a-plane of sapphire as a substrate, wherein a dislocation layer is existent in the vicinity of the interface between the both crystals and the aluminum nitride single crystal has a threading dislocation density of $5 \times 10^6$ cm$^{-2}$ or less.

It is still another object of the present invention to provide an aluminum nitride single crystal multi-layer substrate having an aluminum nitride single crystal film on the c-plane of sapphire as a substrate, wherein a dislocation layer is existent in the vicinity of the interface between the both crystals and the aluminum nitride single crystal has a threading dislocation density of $5 \times 10^6$ cm$^{-2}$ or less.

It is a further object of the present invention to provide a method of forming an aluminum nitride single crystal film on a substrate by heating a sapphire substrate in the presence of carbon, nitrogen and carbon monoxide, wherein an aluminum compound which differs from the raw material sapphire substrate and the formed aluminum nitride single crystal and can control the concentration of aluminum in the above heating atmosphere is made existent in a reduction nitriding reaction system by heating.

It is a still further object of the present invention to provide a method of manufacturing an aluminum nitride single crystal film, wherein aluminum nitride is deposited by an AlN crystal growth technology known per se on the surface of an aluminum nitride single crystal film formed by the above method to increase the thickness of the aluminum nitride single crystal film.

Finally, it is a still further object of the present invention to provide use of the aluminum nitride single crystal film of the present invention as a substrate for ultraviolet light emitting diodes or high-power devices.

BEST MODE FOR EMBODIMENTS OF THE INVENTION

Preferred embodiments of the present invention will be described in detail hereinunder.

In the present invention, an AlN crystal film is formed directly on a raw material sapphire substrate by the reduction nitriding of the surface of the raw material sapphire substrate. Stated more specifically, the raw material sapphire substrate and graphite are charged into a thermal treatment apparatus, and the raw material sapphire substrate is nitrided according to the following reaction formulas in an atmosphere where oxygen potential and nitrogen potential are controlled by adjusting the composition of an $N_2$—CO mixed gas.

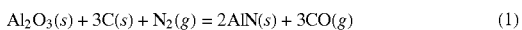

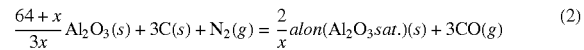

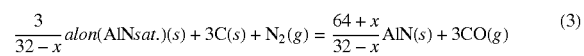

alon refers to aluminum oxynitride represented by $Al_{(64+x)/3}\square_{(8-x)/3}O_{32-x}N_x$ ($\square$ is a cation vacancy), and alon ($Al_2O_3$sat) in the reaction formula (2) means $Al_2O_3$-saturated alon. alon(AlNsat.) in the reaction formula (3) means AlN-saturated alon. Further, x is a variable derived from the non-stoichiometry of alon and takes a value larger than 2 and smaller than 6.

When the total $P_{CO}+P_{N2}$ of the partial pressure of nitrogen and the partial pressure of carbon monoxide constituting the atmosphere in the furnace is 1 bar and the activity ac of carbon is 1, a reaction represented by the reaction formula (1) occurs at a temperature lower than 1,630° C. and reactions represented by the reaction formula (2) and the reaction formula (3) occur at a temperature of 1,630° C. or higher.

Whether these reactions proceed can be presumed from a Gibbs energy change represented by the following general formula.

$$\Delta_{r(x)}G = \Delta_{r(x)}G° + RT \ln K_{r(x)}$$

wherein R is a gas constant, T is an absolute temperature, and $K_{r(x)}$ is an equilibrium constant calculated from the activity of each phase.

Figure 1:
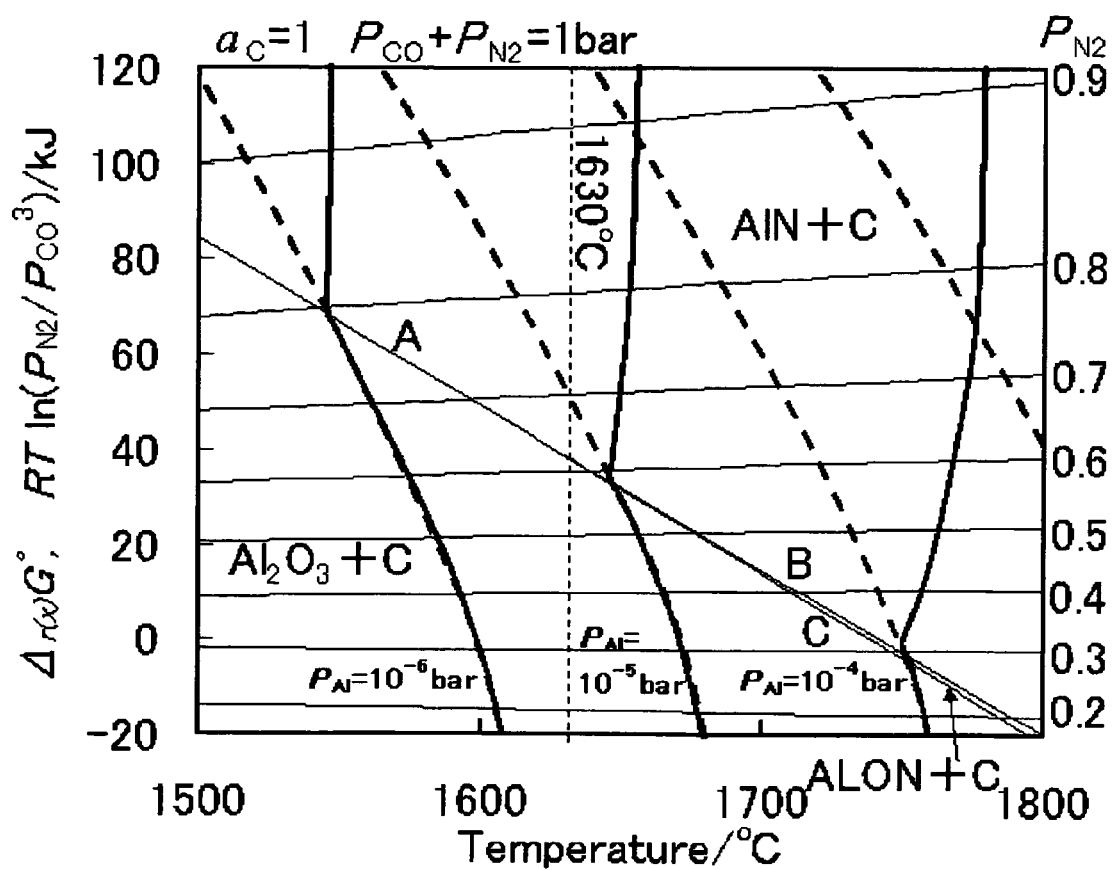
FIG. 1 is an aluminum-oxygen-nitrogen-carbon system phase stability diagram.

FIG. 1 is a graph plotting Celsius temperature on the horizontal axis and the amount of energy on the vertical axis. A straight line A (1,630° C. or lower) and a straight line B (1,630° C. or higher) and a straight line C (1,630° C. or higher) falling in a right direction are obtained by subtracting the functions of standard Gibbs energy variable terms $\Delta_{r(1)}G°$, $\Delta_{r(2)}G°$ and $\Delta_{r(3)}G°$ when 1 mol of $N_2$ is reacted in the above three reaction formulas. Eight horizontal lines in FIG. 1 show nitrogen-equivalent partial pressure curves when the total atmospheric pressure is 1 bar.

When the amount of energy in a so-called RT term constituted by an equilibrium constant and an absolute temperature exceeds the amount of standard Gibbs energy change, the Gibbs energy changes $\Delta_{r(1)}G$, $\Delta_{r(2)}G$ and $\Delta_{r(3)}G$ in the respective reactions become negative and nitriding reaction proceeds. That is, the area above the straight line A and the straight line B in FIG. 1 is an AlN stable area and the area below the straight line A and the straight line C is an $Al_2O_3$ stable area.

At 1,630° C. or higher, an alon stable area is existent at the boundary between the above stable areas. A nitriding reaction proceeds by selecting a temperature condition and the composition of the atmosphere corresponding to the AlN stable area in FIG. 1.

The curves shown by bold solid lines and dotted lines are equivalent partial pressure curves of equilibrium partial pressures of Al (g) in decomposition reactions by which α-alumina and AlN release Al (g) represented by the following reaction formulas.

$$AlN(s) = Al(g) + \frac{1}{2}N_2(g) \quad (4)$$

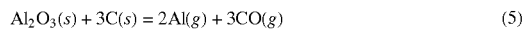

$$Al_2O_3(s) + 3C(s) = 2Al(g) + 3CO(g) \quad (5)$$

The solid lines are equivalent partial pressure curves connecting the equilibrium partial pressures of Al (g) in the decomposition reactions of the stable phases in the respective areas, and the dotted lines are equivalent partial pressure curves for estimating the partial pressure of Al (g) in a decomposition reaction which occurs on the surface of the raw material sapphire substrate in an unreacted or non-equilibrium state placed under an AlN stable condition.

In the decomposition reaction of an aluminum compound such as α-alumina, other chemical species such as $Al_2O$ (g) and $Al_2$(g) other than Al (g) are formed. A reaction among these chemical species always takes place and changes according to the stability of each chemical species which is changed by temperature and a substance existent in a reaction system and reaches the composition of the atmosphere called "equilibrium state" in the end.

As a result, in a reaction system in which a metal element other than aluminum is substantially not existent, the total of equilibrium partial pressures of other chemical species including $Al_2O$ (g) is always about half or less of the equilibrium partial pressure of Al (g) within the temperature and atmosphere ranges shown in FIG. 1. Therefore, the total of equilibrium partial pressures of all the gases of aluminum-containing substances, that is, the concentration of aluminum in the present invention can be estimated at 1 to 2 times the equilibrium partial pressure of Al (g).

In consideration of the equilibrium partial pressures of Al (g) and other aluminum compounds in the present invention, before the decomposition reaction into an aluminum-containing substances on the surface of the unreacted raw material sapphire substrate proceeds markedly, aluminum compounds other than the raw material sapphire substrate are used to make gases of aluminum-containing substances derived therefrom reach the surface of the raw material sapphire substrate. Although aluminum itself and all aluminum compounds can be used as means of supplying the gas, a substance consisting of aluminum, oxygen, nitrogen and carbon which are elements involved in the reaction is preferred in order to prevent impurities from being contained in the obtained AlN crystal.

More preferably, a substance which can easily control the concentration of aluminum in the atmosphere to $10^{-6}$ bar to $10^{-3}$ bar is used. When the concentration of aluminum in the atmosphere falls below the above range, the effect of the present invention is hardly obtained and when aluminum is supplied excessively, a deposition behavior like a process called "vapor-phase epitaxial growth" occurs and AlN crystal whose rotation with the c-axis as the axis of rotation is not fully controlled grows, thereby getting worse the quality of the AlN crystal as a whole.

The above aluminum compounds include aluminum itself, oxides, oxynitrides, nitrides, carbides, organic compounds and ternary and multielement compounds of aluminum. A reduction nitriding reaction in the presence of the aluminum compound is preferably carried out by placing an aluminum compound having relatively high high-temperature stability in the furnace and making an atmosphere to which the compound has been contacted reach the raw material sapphire substrate, or gasifying a low-boiling compound such as an alkyl aluminum and making a mixture of the low-boiling compound gas and a nitrogen gas reach the raw material sapphire substrate in the furnace. To prevent impurities from being contained in the obtained AlN crystal and attain the control of the concentration of aluminum in the atmosphere relatively easily, either one of alumina, aluminum oxynitride and aluminum nitride is preferably placed in the furnace. A composite material of at least one of the above three substances and graphite in a desired ratio may also be preferably used.

The shape of the aluminum compound installed in the furnace is not particularly limited and may be solid, powdery, liquid or porous. The amount of the aluminum compound is desirably determined such that the surface area of the aluminum compound exposed to the surface becomes larger than the surface area of the raw material sapphire substrate to be used for the reaction so that the concentration of aluminum reaches equilibrium swiftly.

When a substance having the same or lower equilibrium partial pressure of a gas of an aluminum-containing substance formed by the decomposition reaction than the raw material sapphire substrate and the AlN single crystal film under the same conditions is used as an aluminum compound, means of increasing the amount of a gas generated by placing it at a temperature higher than the temperature of the raw material sapphire substrate is effective.

To manufacture an aluminum nitride single crystal film, the raw material sapphire substrate is placed in the AlN stable area at 1,630° C. or higher to form the structure of an alon layer-containing nitride substrate proposed in JP-A 2004-137142 through reactions represented by the reaction formulas (2) and (3). The substrate forming this structure is cooled to 1,630° C. or lower, placed in a state where alon is thermodynamically unstable and activation energy for decomposing it into an AlN component or an alumina component is given for a long time and then cooled gradually to eliminate the residual strain caused by the difference in thermal expansion between the raw material sapphire substrate and the AlN crystal film, thereby obtaining the substrate of the present invention.

In the above method, alon is formed at a high temperature and decomposed while it is cooled to obtain the AlN single crystal multi-layer substrate of the present invention. This is not essential to obtain the effect of the manufacturing method of the present invention. That is, even when AlN single crystal is formed by the reaction represented by the reaction formula (1) in the AlN stable area at a temperature lower than 1,630° C. and cooled gradually, or even when the AlN single crystal is cooled rapidly in accordance with the manufacturing method proposed by JP-A 2004-137142, the quality of the obtained AlN single crystal film is improved.

The heating apparatus used in the method of nitriding the surface of the above raw material sapphire substrate directly is not particularly limited and a heating apparatus having a desired structure may be used. However, the heating apparatus must be able to expose the raw material sapphire substrate to a temperature condition shown in FIG. 1 in a mixed gas of nitrogen and carbon monoxide. The heating apparatus is desirably designed to maintain the temperature difference in the raw material sapphire substrate at 5° C. or less. The heating furnace is desirably made of only graphite, α-alumina, AlN and alon which are substances involved in the reaction to prevent impurities from being contained in the obtained AlN crystal. It is more desirably made of graphite alone in order to control the concentration of aluminum in the atmosphere reaching the raw material sapphire substrate. Since water vapor or an organic substance adsorbed to the material of the furnace increases the concentration of oxygen in the furnace at the time of heating and becomes the factor of changing the composition of the atmosphere to exert an influence upon the reaction behavior, it is desired to introduce a removal step for cleaning by heating before manufacture or vacuuming at a temperature lower than 1,000° C. in the temperature elevating step.

Preferably, the raw material sapphire substrate in use has a smooth surface in order to obtain high-quality AlN crystal whose orientation is controlled. Therefore, an ordinary sapphire substrate for epitaxial growth is preferably used. To form an AlN single crystal film having the feature of the present invention on the surface of this substrate, though any plane may be used as the crystal plane of the substrate, the $\{1\ 1\ -2\ 0\}$ plane (to be referred to as "a-plane" hereinafter) and the $\{0\ 0\ 0\ 1\}$ plane (to be referred to as "c-plane" hereinafter) are preferably used, since the obtained AlN single crystal apts to have c-axis orientation. The size of the substrate is preferably 15 to 180 cm².

Various commercially available products of carbon which is made existent in the reaction system, including the material of the furnace, may be used. The purity of carbon is preferably 99.9% or more, more preferably 99.999% or more.

The types of the gases to be introduced are not limited to nitrogen and carbon monoxide. For example, the same effect as that of the present invention can be obtained even when oxygen is introduced in place of carbon monoxide and reacted with graphite in the furnace to form carbon monoxide which is used in the reaction.

Nitrogen and carbon monoxide in a gaseous state are generally used but preferably as pure as possible. In general, nitrogen having a purity of 99.9999% or more and carbon monoxide having a purity of 99.9% or more are used. An oxygen atom generated by the decomposition of chemical species such as carbon dioxide and water vapor of impurities changes the chemical potential of a nitriding reaction and becomes an error factor for control parameters. Therefore, it is desired to prevent the entry of these substances as much as possible.

Although the total pressure of the reaction system is not particularly limited, it is preferably set to around 1 bar from the viewpoint of the ease of manufacturing or operating a reactor. During the reaction, a mixed gas having a predetermined partial pressure is caused to flow at a predetermined rate. The mixing ratio of nitrogen and carbon monoxide is determined from a range which falls within the AlN stable area $(P_{N2}/P_{CO}^3)$ according to reaction temperature based on the phase stability graph shown in FIG. 1.

The difference between the value of the RT term which is determined by the selection of the reaction temperature T and $(P_{N2}/P_{CO}^3)$ and the standard Gibbs energy change term $\Delta_{r(1)}G°$, $\Delta_{r(2)}G°$ or $\Delta_{r(3)}G°$ is a substantial index of nitriding drive force. This corresponds to the distance between the coordinates of the straight line showing the amount of standard Gibbs energy change and the coordinates determined nonquivocally by selected condition on the vertical axis in FIG. 1.

To obtain the maximum effect of the direct nitriding reaction, this nitriding drive force must be set to a suitable value. As several examples of ideal nitriding drive force when 1 mol of $N_2$ is reacted in the above three reaction formulas, the ratio of a mixed gas is desirably selected to obtain a nitriding drive force of 0 to 30 kJ at 1,750° C., 0 to 100 kJ at 1,675° C. and 0 to 150 kJ at 1,600° C. When the nitriding drive force exceeds the above range, a phenomenon that AlN$\{0\ 0\ 0\ 2\}$ planes almost parallel to a plurality of equivalent crystal planes are formed due to the symmetry of the raw material sapphire crystal tends to occur, whereby the formation of a single crystal film becomes difficult.

As for the flow rate of a mixed gas, it is preferred that a 25° C. 1 atm gas should be introduced at a rate of 5 ml/min or more based on 1 cm² of the sectional area of the reactor on the plane perpendicular to the gas flow because it is always necessary to make a nitrogen atom reach the surface of the substrate. More preferably, a preheating apparatus for preheating the gas introduced before reaching the raw material sapphire substrate is installed. For the control of the partial pressures of carbon monoxide and nitrogen to be introduced, a commercially available flow meter may be used.

Although the heating rate can be set to any value, a heating rate of 5° C. or higher/minute is preferably employed. In consideration of the fact that the equilibrium partial pressure of the decomposition reaction of α-alumina sharply rises according to temperature, the supply of gases of aluminum-containing substances is started without a delay. It is desired to start the supply of the gases of the aluminum-containing substances before the raw material sapphire substrate is exposed to more than $10^{-6}$ bar in the equivalent partial pressure curve of Al (g) shown in FIG. 1 at the latest.

The heating time is suitably determined according to a desired AlN film thickness. For example, when the raw material sapphire substrate cut out on the a-plane is nitrided at 1,675° C., $P_{CO}$=0.10 bar and $P_{N2}$=0.90 bar in a heating apparatus made of graphite as only the furnace material (to be called "graphite furnace" hereinafter), the growth rate of an AlN film is 5 to 20 nm for a 12-hour reaction and the growth rate of an alon layer is 5 to 10 nm for a 12-hour reaction.

After the end of the reaction, as AlN is oxidized in the $Al_2O_3$ stable area in FIG. 1 during cooling, means of gradually reducing the concentration of carbon monoxide is always taken at a temperature higher than 1,000° C. to place the substrate in an AlN stable state. To this end, the supply of carbon monoxide is stopped before the start of cooling, and only nitrogen is kept supplied to reduce the concentration of carbon monoxide in the reaction system to less than 0.1%. Even at a temperature of 1,000° C. or lower, it is desired to keep supplying only nitrogen so as to reduce the concentration of carbon monoxide as much as possible.

As for the cooling rate, as described above, cooling is carried out for a time long enough to form a dislocation layer in the vicinity of the interface between the raw material sapphire substrate and the AlN single crystal film. To prevent the residual strain caused by the difference in thermal expansion between the raw material sapphire substrate and the AlN single crystal film, it is not preferred to set a time during which the cooling rate exceeds 20° C./min. At area of 1,630° C. or lower in the phase stability graph of FIG. 1, the $Al_2O_3$ stable area is not suitable because the AlN single crystal film is oxidized as described above. In the 1,100° C. or lower area, the activation energy with which alon is converted into AlN or alumina or the diffusion speed of atoms is considered as unsatisfactory and not preferred as a condition for decomposing alon. Therefore, the cooling conditions are desirably such that the cooling rate is always kept at 20° C. or lower per minute and a time during which the nitrided substrate is left at 1,630 to 1,100° C. according to the amount of the formed alon is set.

The AlN single crystal multi-layer substrate which shows the effect of the present invention fully can be manufactured by the above method.

Samples for cross-sectional observation are cut out from random location of the manufactured AlN single crystal multi-layer substrate and sliced to a thickness of about 100 nm by using an FIB apparatus or ion milling apparatus.

The density of threading dislocations is measured from a TEM observation image of these sample.

The crystal quality is evaluated with a full width of half maximum of an X-ray diffraction ω-mode rocking curve. As described in the Description of the Prior Art, the crystal quality can be judged by the measurement value of full width of half maximum. To confirm that crystals are uniform in all the 3-dimensional directions, the {0 0 0 2} plane and the {1 −1 0 0} plane which are perpendicular to each other are measured.

Since X-rays taken out from a generator for X-ray diffraction analysis have at least a wavelength distribution and are generated from a target in all directions, measurement errors caused by the apparatus greatly change according to the monochromation treatment of wavelengths which is made on incident X-rays and the control degree of the divergent angle. Further, since the AlN single crystal film obtained in the present invention is as thin as several nm to several tens of nm, the influence of broadening of a peak represented by a Scherrer's formula is large and the measurement errors are large when the resolution on the optical receiving side of diffracted X-rays is low.

In order to greatly reduce the measurement errors to be added to the expansion of the full width at half maximum caused by the crystal to be measured, a monochromator having double crystals must be installed on the injection side and an analyzer crystal must be introduced on the optical receiving side to reduce their angle resolutions sufficiently. For the analysis of thin film crystal, an X-ray diffraction apparatus having a resolution of 30 arcsec or less is generally used.

The measurement value of the crystal orientation of the AlN single crystal which is the feature of the AlN single crystal multi-layer substrate of the present invention is obtained by a measurement apparatus having a resolution of 30 arcsec or less. The apparatus and measurement conditions used are shown in Table 1.

TABLE 1

| | |
|---|---|
| Manufacturer of measurement apparatus | PANalitical Division of Spectris Co., Ltd. |
| Reference Number of Measurement apparatus | X' Pert-MRD |
| X-ray source/diffractometer | An X-ray tube with copper anode/parallel beam method |
| Incident optical system/resolution | multi-layer film mirror and asymmetrical Ge(2 2 0) crystal/two times of reflection/ resolution of 24 arcsec |
| Receiving optical system | symmetrical Ge(2 2 0) crystal/3 times of diffraction/resolution of 12 arcsec |

As described above, according to the present invention, aluminum-containing substances (aluminum compounds) other than the raw material sapphire substrate and the formed aluminum nitride single crystal are made co-existent in the reaction atmosphere as aluminum sources in addition to a mixed gas of nitrogen and carbon monoxide which is introduced as a reaction substance when the raw material sapphire substrate is subjected to a nitriding reaction in order to control the concentration of aluminum in the reaction atmosphere to a suitable value, and the generated gas is caused to reach the surface of the raw material sapphire substrate and the surface of the formed aluminum nitride single crystal.

By this method, gases of aluminum-containing substances generated from α-alumina and AlN under the reaction conditions are supplemented by a substance other than the substrate, and the orientation of AlN crystal in multiple directions and the formation of an inversion domain are prevented so as to prevent the decomposition of atoms on the most surface of the substrate and keep the state of the exposed atomic layer uniform.

The gases of the aluminum-containing substances refer to gases consisting of a compound containing an aluminum atom and aluminum itself. The concentration of aluminum in the reaction atmosphere to be controlled in the present invention refers to the total of partial pressures of the gases of the aluminum-containing substances.

Since drive force for moving an aluminum atom to the surface from the inside of the substrate is reduced, it is possible to suppress the movement of aluminum in the inside of the substrate and promote substitution between an oxygen atom and a nitrogen atom while maintaining the regularity of the crystal lattice.

The quality of the AlN single crystal film obtained by the invention of Japanese Patent Application No. 2005-31086 is greatly improved by combining the manufacturing process of the present invention with the method of manufacturing an AlN single crystal multi-layer substrate characterized by an interfacial structure proposed as Japanese Patent Application No. 2005-031086, thereby obtaining the AlN single crystal multi-layer substrate of the present invention.

Further, the thickness of the AlN single crystal film on the obtained AlN single crystal multi-layer substrate can be increased by using an AlN crystal growth technology known per se while the properties of the AlN single crystal film of the present invention are maintained. The AlN crystal growth technology is not particularly limited, as exemplified by MOVPE, HVPE and flux method. HVPE is preferred because its expected growth rate is high.

AlN crystal growth by HVPE is possible with a combination of an aluminum halide and a nitride compound as raw material gases and a material for a reactor having corrosion resistance to these substances. The reactor is desirably made of a material having high heat resistance or material which are hardly heated by the absorption of radiation energy from another high-temperature substance. A combination of aluminum trichloride and ammonia as raw material gases and quartz as the material of the reactor is suitable.

In the above combination of the raw material gases and the material of the reactor, the temperature of the above AlN single crystal film may be 600° C. or higher but desirably 1,200° C. or higher in order to increase the growth rate of AlN single crystal. If heating is carried out at a temperature of the melting point of the material of the reactor or higher, the same effect is obtained even when a high temperature is created with a mechanism for heating only the AlN single crystal film and not the material of the reactor.

The thickness of the AlN single crystal film of the present invention can be increased in the above embodiment.

Thereafter, an AlN single crystal film from which the residual stress dependent upon the difference in thermal expansion coefficient between AlN and sapphire has been excluded can be manufactured by cutting off an unreacted sapphire portion.

Although existing non-oxide ceramic processing technology may be used without limitation to cut off the AlN single crystal film and the unreacted sapphire portion, a method with which the amount of abrasion is small at the time of processing is desired and a method of cutting off with a wire saw or diamond cutter is preferred.

The AlN single crystal film and the AlN single crystal multi-layer substrate which show the effect of the present invention fully can be manufactured by the above method.

The AlN single crystal film and the AlN single crystal multi-layer substrate of the present invention can be used as a substrate material for use in ultraviolet light emitting diodes for white light sources and sterilization, AlN single crystal free-standing substrate for high-power devices such as laser light sources or seed crystals for manufacturing these.

EXAMPLES

The following examples are provided for the purpose of further illustrating the present invention but are in no way to be taken as limiting.

Example 1

Figure 2:
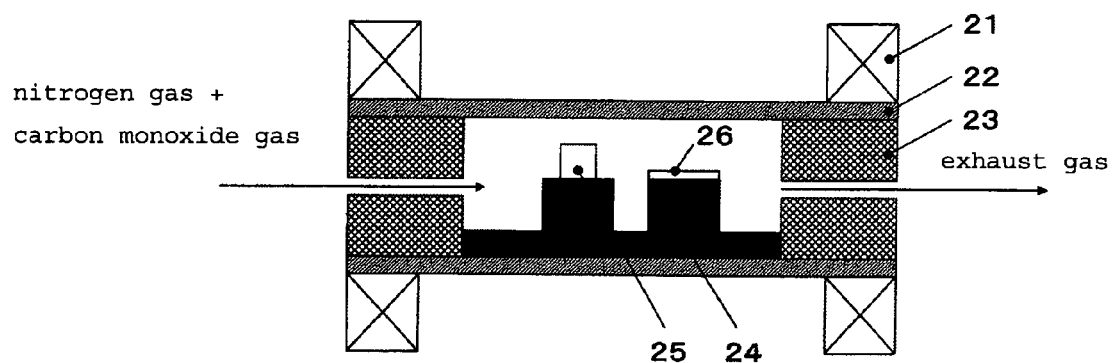
FIG. 2 is a conceptual plan view of a reactor used in Examples.

A reaction system shown in FIG. 2 was used, sintered AlN was used as an aluminum compound other than a raw material sapphire substrate to nitride the disk-like raw material sapphire substrate having a diameter of 50.8 mm cut out on the a-plane with a $N_2$—CO mixed gas at 1,675° C., and the nitrided raw material sapphire substrate was cooled gradually to manufacture an AlN single crystal film having a dislocation layer at the interface between AlN and raw material sapphire.

A graphite block 24 mounting sintered AlN as an aluminum source 25 was placed in a heating furnace 22 and infrared light generated from this graphite block by heating was measured with a radiation thermometer to control the temperature of the raw material substrate. In FIG. 2, reference numeral 21 denotes a ring electrode and 23 a heat insulating material.

The raw material sapphire substrate 26 was placed close to an exhaust gas port so that gas passing near the sintered AlN as an aluminum source could be applied thereto. The installation position of the raw material sapphire substrate was adjusted to ensure that the temperature of the sintered AlN became 15° C. higher than the temperature of the raw material sapphire substrate and the gas of the aluminum-containing substance was supplied fully based on the equilibrium partial pressure of the raw material sapphire substrate.

The inside of the furnace was first evacuated by a rotary pump and substituted by a mixed gas having a carbon monoxide partial pressure of 0.10 bar and a nitrogen partial pressure of 0.90 bar and the atmosphere having this composition was caused to flow at a predetermined rate.

An exhaust valve was opened at 1.02 bar and the pressure was maintained at almost 1 bar during heating.

The sintered AlN was heated up to 1,690° C. at a rate of 10° C./min in order to place the raw material sapphire substrate at a temperature of 1,675° C. and maintained at 1,690° C. for 12 hours. After the passage of 12 hours, the introduction of carbon monoxide was stopped while the temperature was maintained at 1,690° C., pure nitrogen was caused to flow in an amount 2 times larger than the capacity of the furnace for 30 minutes to substitute the atmosphere in the furnace by nitrogen, and the furnace was cooled at a rate of 20° C. or less per minute.

Samples collected from 5 arbitrary positions of the obtained AlN single crystal multi-layer substrate were sliced by ion milling, and the cross-sections of the slices were observed by TEM. The average thickness of the samples observed was about 0.1 μm. Since a 40 μm-wide film could be observed from each sample, the number of defects in a 4 μm² area of the substrate was measured for each sample.

No threading dislocation was observed in the view fields of the 5 samples obtained in this example. When the density of threading dislocations is estimated at maximum and one threading dislocation exists in a 20 μm² area of the observed substrate, it is concluded that the number of threading dislocations is $5\times10^6$ per cm² and the density of threading dislocations in the AlN single crystal obtained in this example is $5\times10^6$ or less. In the TEM observation images of all the samples, the existence of a dislocation layer at the interface between AlN and raw material sapphire was confirmed.

As a result of X-ray diffraction analysis, it was found that the nitride film obtained in this example was made of AlN single crystal having the following crystal orientation relationships.

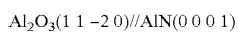

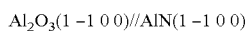

When the crystal quality of the AlN single crystal film was evaluated with a full width of half maximum of the X-ray diffraction ω-mode rocking curve, the measurement value of the AlN{0 0 0 2} plane parallel to the surface of the substrate was 106 arcsec and the measurement value of the AlN {1 −1 0 0} plane perpendicular to the surface of the substrate was 162 arcsec.

Example 2

A disk-like raw material sapphire substrate having a diameter of 50.8 mm cut out on the c-plane was nitrided with a $N_2$—CO mixed gas at 1,600° C. and cooled gradually like Example 1 to manufacture an AlN single crystal film having a dislocation layer at the interface between AlN and raw material sapphire. As the atmosphere in the furnace was used a mixed gas having a carbon monoxide partial pressure of 0.10 bar and a nitrogen partial pressure of 0.90 bar. Other reaction conditions were made the same as in Example 1. That is, sintered AlN was used in the reaction as an aluminum source by controlling its target temperature to 1,615° C.

When the surface roughness of a 10 μm square area of the surface of the obtained multi-layer substrate was measured with a scanning probe microscope (SPA-400 of SII Nanotechnology Inc, dynamic force mode), it was found that the film had an excellent surface with an Ra of 0.23 nm and an RMS of 0.33 nm.

When the cross-section of the obtained multi-layer substrate was observed through TEM to evaluate the density of defects, no threading dislocation was seen in a 20 μm² observation area. It was then concluded that the density of threading dislocations in the AlN single crystal film obtained in this example was 5×10⁶ or less like Example 1. In TEM observation images of all the samples, the existence of a dislocation layer at the interface between AlN and raw material sapphire was confirmed.

As a result of X-ray diffraction analysis, it was found that the nitride film obtained in this example was made of AlN single crystal which satisfied the following crystal orientation relationships.

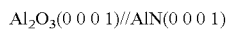

Al₂O₃(0 0 0 1)//AlN(0 0 0 1)

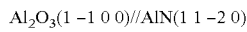

Al₂O₃(1 –1 0 0)//AlN(1 1 –2 0)

When the crystal quality of the AlN single crystal film was evaluated with a full width of half maximum of the X-ray diffraction ω-mode rocking curve, the measurement value of the AlN {0 0 0 2} plane parallel to the surface of the substrate was 165 arcsec and the measurement value of the AlN {1 –1 0 0} plane perpendicular to the surface of the substrate was 540 arcsec.

Example 3

A disk-like raw material sapphire substrate having a diameter of 50.8 mm cut out on the c-plane was nitrided with a N₂—CO mixed gas at 1,675° C. and cooled gradually like Example 1 to manufacture an AlN single crystal film having a dislocation layer at the interface between AlN and raw material sapphire. As the atmosphere in the furnace was used a mixed gas having a carbon monoxide partial pressure of 0.40 bar and a nitrogen partial pressure of 0.60 bar. Other reaction conditions were made the same as in Example 1. That is, sintered AlN was used in the reaction as an aluminum source by controlling its target temperature to 1,690° C. The existence of a dislocation layer at the interface between AlN and raw material sapphire was confirmed in a TEM observation image.

As a result of X-ray diffraction analysis, it was found that the nitride film obtained in this example was made of AlN single crystal having the same crystal orientation relationships as in Example 2.

When the crystal quality of the AlN single crystal film was evaluated with a full width of half maximum of the X-ray diffraction ω-mode rocking curve, the measurement value of the AlN {0 0 0 2} plane parallel to the surface of the substrate was 125 arcsec and the measurement value of the AlN {1 –1 0 0} plane perpendicular to the surface of the substrate was 876 arcsec.

Example 4

An AlN single crystal film having a dislocation layer at the interface between AlN and raw material sapphire was manufactured by nitriding a disk-like raw material sapphire substrate having a diameter of 50.8 mm cut out on the a-plane with a N₂—CO mixed gas at 1,675° C. and gradually cooling it in the same manner as in Example 1 except that the aluminum compound other than the raw material sapphire substrate was changed from sintered AlN to sintered alumina. Conditions other than the used aluminum compound were made the same as in Example 1. That is, the sintered alumina was used in the reaction as an aluminum source by controlling its target temperature to 1,690° C. The existence of a dislocation layer at the interface between AlN and raw material sapphire was confirmed in a TEM observation image.

As a result of X-ray diffraction analysis, it was found that the nitride film obtained in this example was made of AlN single crystal having the same crystal orientation relationships as in Example 1.

When the crystal quality of the AlN single crystal film was evaluated with a full width of half maximum of the X-ray diffraction ω-mode rocking curve, the measurement value of the AlN {0 0 0 2} plane parallel to the surface of the substrate was 127 arcsec and the measurement value of the AlN {1 –1 0 0} plane perpendicular to the surface of the substrate was 237 arcsec.

Comparative Example 1

An experiment was conducted by changing the reaction system from the constitution shown in FIG. 2 such that the sintered AlN as an aluminum source was removed and the raw material sapphire substrate installed near the exhaust gas port was moved to the position of the sintered AlN. In this constitution, an AlN single crystal film having a dislocation layer at the interface between AlN and raw material sapphire was manufactured by nitriding a disk-like raw material sapphire substrate having a diameter of 50.8 mm cut out on the a-plane with a N₂—CO mixed gas at 1,675° C. and gradually cooling it. Since the raw material sapphire substrate was placed on a graphite block to be measured with a radiation thermometer at the time of heating, the graphite block was used in the reaction by controlling its target temperature to 1,675° C. As the atmosphere in the furnace was used a mixed gas having a carbon monoxide partial pressure of 0.10 bar and a nitrogen partial pressure of 0.90 bar. Other details of operation were made the same as in Example 1. The existence of a dislocation layer at the interface between AlN and raw material sapphire was confirmed in a TEM observation image.

As a result of X-ray diffraction analysis, it was found that the nitride film obtained in this example was made of AlN single crystal having the following crystal orientation relationships.

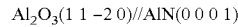

Al₂O₃(1 1 –2 0)//AlN(0 0 0 1)

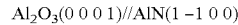

Al₂O₃(0 0 0 1)//AlN(1 –1 0 0)

When the crystal quality of the AlN single crystal film was evaluated with a full width of half maximum of the X-ray diffraction ω-mode rocking curve, the measurement value of the AlN {0 0 0 2} plane parallel to the surface of the substrate was 472 arcsec and the measurement value of the AlN {1 –1 0 0} plane perpendicular to the surface of the substrate was 379 arcsec.

Comparative Example 2

An AlN single crystal film having a dislocation layer at the interface between AlN and raw material sapphire was manufactured by nitriding a disk-like raw material sapphire substrate having a diameter of 50.8 mm cut out on the c-plane with a N₂—CO mixed gas at 1,600° C. and gradually cooling it in the same manner as in Comparative Example 1. As the atmosphere in the furnace was used a mixed gas having a carbon monoxide partial pressure of 0.10 bar and a nitrogen partial pressure of 0.90 bar. Other reaction conditions were made the same as in Comparative Example 1. The existence of a dislocation layer at the interface between AlN and raw material sapphire was confirmed in a TEM observation image.

As a result of X-ray diffraction analysis, it was found that the nitride film obtained in this example was made of AlN single crystal having the same crystal orientation relationships as in Example 2.

When the crystal quality of the AlN single crystal film was evaluated with a full width of half maximum of the X-ray diffraction ω-mode rocking curve, the measurement value of the AlN {0 0 0 2} plane parallel to the surface of the substrate was 438 arcsec and the measurement value of the AlN {1 −1 0 0} plane perpendicular to the surface of the substrate was 1691 arcsec.

Comparative Example 3

An AlN single crystal film having a dislocation layer at the interface between AlN and raw material sapphire was manufactured by nitriding a disk-like raw material sapphire substrate having a diameter of 50.8 mm cut out on the c-plane with a $N_2$—CO mixed gas at 1,675° C. and gradually cooling it in the same manner as in Comparative Example 1. As the atmosphere in the furnace was used a mixed gas having a carbon monoxide partial pressure of 0.40 bar and a nitrogen partial pressure of 0.60 bar. Other reaction conditions were made the same as in Comparative Example 1. The existence of a dislocation layer at the interface between AlN and raw material sapphire was confirmed in a TEM observation image.

Figure 3:
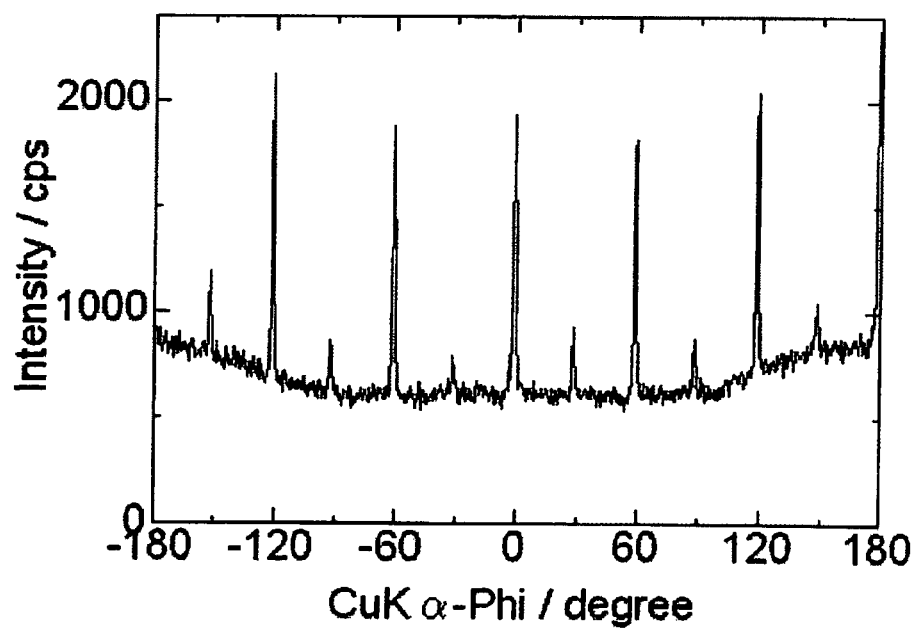
FIG. 3 is a φ-axis scan chart of the X-ray diffraction of an AlN film oriented in multiple directions obtained in Comparative Example 3.

As a result of X-ray diffraction analysis, it was found that the nitride film obtained in this comparative example did not satisfy the requirement for single crystal because two different kinds of crystals which turned at 1° forward and backward with the c-axis as the axis of rotation while sharing the c-axis of AlN were existent though it had almost the same crystal orientation relationships as in Example 2. FIG. 3 is a chart obtained by scanning the φ-axis on the AlN {1 −1 0 0} plane perpendicular to the surface of the substrate of the AlN film obtained in this comparative example. X-ray was input by inclining the angle formed by the injection side and the optical receiving side at 1° with respect to the side face of the multi-layer substrate obtained in this example as the diffraction angle of the AlN{1 −1 0 0} plane in X-ray diffraction analysis, and the substrate was turned in this state with the normal of the surface of the substrate as the axis of rotation to specify the orientation direction of the AlN{1 −1 0 0} plane.

When the crystal quality of the AlN single crystal film was evaluated with a full width of half maximum of the X-ray diffraction ω-mode rocking curve, the measurement value of the AlN {0 0 0 2} plane parallel to the surface of the substrate was 1153 arcsec and the measurement value of the AlN {1 −1 0 0} plane perpendicular to the surface of the substrate of one separated peak was 867 arcsec.

Comparative Example 4

An AlN single crystal film having a dislocation layer at the interface between AlN and raw material sapphire was manufactured by nitriding a disk-like raw material sapphire substrate having a diameter of 50.8 mm cut out on the a-plane with a $N_2$—CO mixed gas at 1,675° C. and gradually cooling it in the same manner as in Comparative Example 1. As the atmosphere in the furnace was used a mixed gas having a carbon monoxide partial pressure of 0.40 bar and a nitrogen partial pressure of 0.60 bar. Other reaction conditions were made the same as in Comparative Example 1. The existence of a dislocation layer at the interface between AlN and raw material sapphire was confirmed in a TEM observation image.

Figure 4:
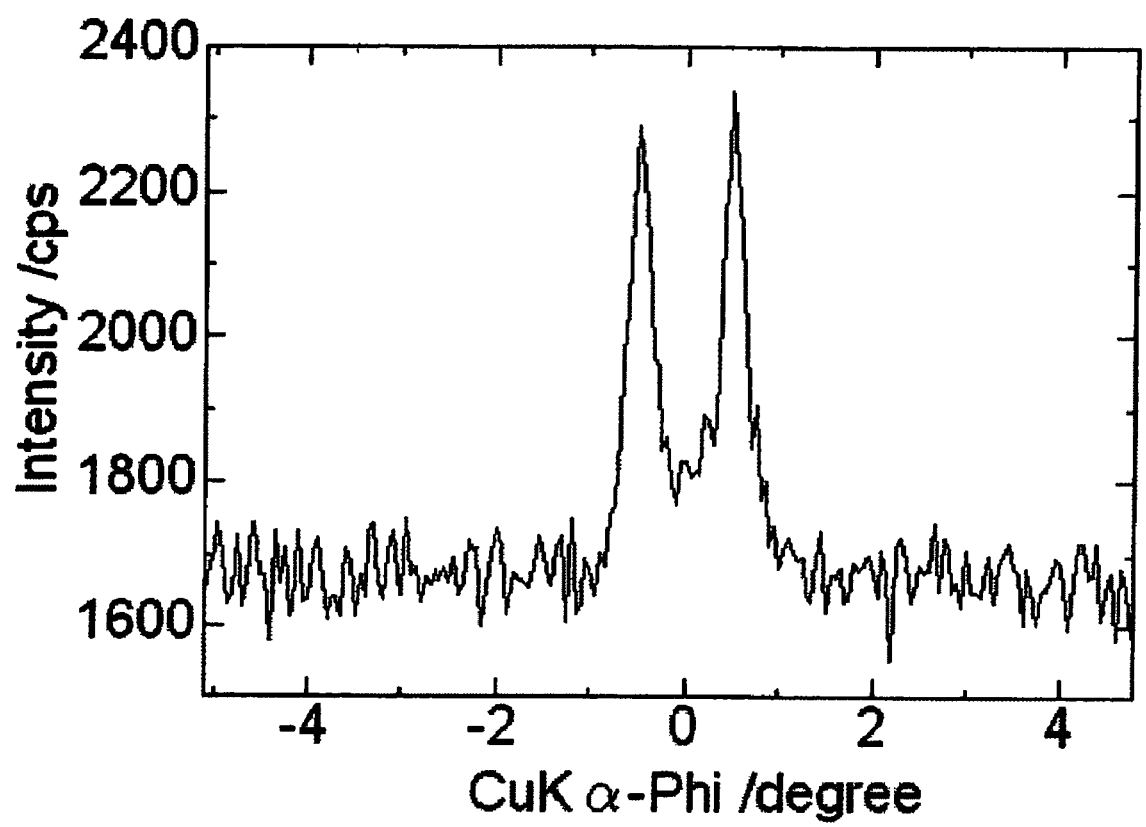
FIG. 4 is a φ-axis scan chart of the X-ray diffraction of an AlN film oriented in multiple directions obtained in Comparative Example 4.

As a result of X-ray diffraction analysis, it was found that the nitride film obtained in this comparative example was made of a mixture of AlN crystal having the same crystal orientation relationships as in Example 1 and AlN crystal having the same crystal orientation relationships as in Comparative Example 1. FIG. 4 is a chart obtained by scanning the φ-axis on the AlN {1 −1 0 0} plane perpendicular to the surface of the substrate of the AlN film obtained in this comparative example. The both crystals turned at 30° with the c-axis as the axis of rotation while sharing the c-axis of AlN and did not satisfy the requirement for single crystal.

When the crystal quality of the AlN single crystal film was evaluated with a full width of half maximum of the X-ray diffraction ω-mode rocking curve, the measurement value of the AlN {0 0 0 2} plane parallel to the surface of the substrate was 578 arcsec and the measurement value of the AlN {1 −1 0 0} plane perpendicular to the surface of the substrate of a domain where a strong peak appeared was 1548 arcsec.

The results are shown in Table 2.

TABLE 2

| | Crystal plane of sapphire substrate | aluminum source | substrate temperature (° C.) | atmosphere composition (bar) | | full width at half maximum on AlN{0 0 0 2} (arcsec) | full width at half maximum on AlN{1 −1 0 0} (arcsec) |
|---|---|---|---|---|---|---|---|
| | | | | $N_2$ | CO | | |
| Example 1 | a | AlN | 1675 | 0.9 | 0.1 | 106 | 162 |
| Example 2 | c | AlN | 1600 | 0.9 | 0.1 | 165 | 540 |
| Example 3 | c | AlN | 1675 | 0.6 | 0.4 | 125 | 876 |
| Example 4 | a | $Al_2O_3$ | 1675 | 0.9 | 0.1 | 127 | 237 |
| Comparative Example 1 | a | none | 1675 | 0.9 | 0.1 | 472 | 379 |
| Comparative Example 2 | c | none | 1600 | 0.9 | 0.1 | 438 | 1691 |
| Comparative Example 3 | C | none | 1675 | 0.6 | 0.4 | 1153 | 867 (peak separation) |
| Comparative Example 4 | a | none | 1675 | 0.6 | 0.4 | 578 | 1548 (mixed domain) |

The invention claimed is:

1. An aluminum nitride single crystal film comprising aluminum nitride single crystal having an area of 15 cm² or more and a threading dislocation density of $5\times10^{-6}$ cm$^{-2}$ or less.

2. The aluminum nitride single crystal film according to claim 1, wherein the crystal orientation of the {0 0 0 2} plane of the aluminum nitride single crystal is 200 arcsec or less and the crystal orientation of the {1 −1 0 0} plane is 900 arcsec or less.

3. A substrate for an ultraviolet light emitting diode or a high-output device comprising the aluminum nitride single crystal film of claim 1 or 2.

4. An aluminum single crystal multi-layer substrate having an aluminum nitride single crystal film on the a-plane of single crystal α-alumina as a substrate, wherein a dislocation layer is existent between the both crystals and the aluminum nitride single crystal has a threading dislocation density of $5\times10^6$ cm$^{-2}$ or less.

5. The aluminum nitride single crystal multi-layer substrate according to claim 4, wherein the crystal orientation of the {0 0 0 2} plane of the aluminum nitride single crystal is 200 arcsec or less and the crystal orientation of the {1 −1 0 0} plane is 300 arcsec or less.

6. The aluminum nitride single crystal multi-layer substrate according to claim 4 or 5 which has an area of 15 cm² or more.

7. An aluminum nitride single crystal multi-layer substrate having an aluminum nitride single crystal film on the c-plane of single crystal α-alumina as a substrate, wherein a dislocation layer is existent between the both crystals and the aluminum nitride single crystal has a threading dislocation density of $5\times10^6$ cm$^{-2}$ or less.

8. The aluminum nitride single crystal multi-layer substrate according to claim 7, wherein the crystal orientation of the {0 0 0 2} plane of aluminum nitride single crystal is 200 arcsec or less and the crystal orientation of the {1 −1 0 0} plane is 900 arcsec or less.

9. The aluminum nitride single crystal multi-layer substrate according to claim 7 or 8 which has an area of 15 cm² or more.

* * * * *